United States Patent
Kaltalioglu et al.

(10) Patent No.: US 7,307,346 B2
(45) Date of Patent: Dec. 11, 2007

(54) FINAL PASSIVATION SCHEME FOR INTEGRATED CIRCUITS

(75) Inventors: Erdem Kaltalioglu, Hopewell Junction, NY (US); Christian Pils, Shanghai (CN)

(73) Assignee: Infineon Technologies AG, Munich (DE)

( * ) Notice: Subject to any disclaimer, the term of this patent is extended or adjusted under 35 U.S.C. 154(b) by 179 days.

(21) Appl. No.: 10/847,901

(22) Filed: May 18, 2004

(65) Prior Publication Data

US 2005/0260842 A1 Nov. 24, 2005

(51) Int. Cl.
*H01L 23/48* (2006.01)
*H01L 23/52* (2006.01)
*H01L 29/40* (2006.01)

(52) U.S. Cl. .............. 257/760; 257/E23.173
(58) Field of Classification Search ......... 257/760
See application file for complete search history.

(56) References Cited

U.S. PATENT DOCUMENTS

| | | | |
|---|---|---|---|
| 6,265,780 B1 * | 7/2001 | Yew et al. | 257/759 |
| 6,713,873 B1 * | 3/2004 | O'Loughlin et al. | 257/758 |
| 6,774,059 B1 * | 8/2004 | Chuang et al. | 438/791 |
| 6,798,043 B2 * | 9/2004 | Steiner et al. | 257/637 |
| 6,849,536 B2 * | 2/2005 | Lee et al. | 438/622 |
| 6,949,830 B2 * | 9/2005 | Owada et al. | 257/760 |
| 7,005,752 B2 * | 2/2006 | Bojkov et al. | 257/786 |
| 2002/0014705 A1 * | 2/2002 | Ishio et al. | 257/784 |

* cited by examiner

*Primary Examiner*—David A. Zarneke
(74) *Attorney, Agent, or Firm*—Slater & Matsil, L.L.P.

(57) ABSTRACT

A semiconductor device includes a substrate with an active area. A last level interconnect capping layer is disposed over the active area. A buffer layer/crack stop layer overlies the last level interconnect capping layer and a passivation layer overlies the buffer layer/crack stop layer. Also, a contact pad (e.g., probe pad, wire bond pad or flip-chip pad) overlies the passivation layer.

17 Claims, 2 Drawing Sheets

US 7,307,346 B2

FINAL PASSIVATION SCHEME FOR INTEGRATED CIRCUITS

TECHNICAL FIELD

The present invention relates generally to integrated circuits, and more particularly to a final passivation scheme for integrated circuits.

BACKGROUND

It is known and necessary that finally produced integrated circuits (chips) must be tested in the wafer compound to find out the good dies. Such a test is performed with so-called wafer prober equipments that have needle cards or similar contacting elements, which are used to realize an electrical contact between the tips of the needles or the other contacting elements and contact pads made of aluminum or another metal on the wafer.

As soon as the electrical contact is realized, the wafer prober generates test sequences for testing the integrated circuit. To realize a good electrical contact between the tips of the needles of the needle card and the Al pads it is necessary to generate a contact with sufficient force between the contact partners so that the result is a good electrical contact.

Current probing/testing operations at wafer level are known to induce cracks in the passivation layers below the probing area due to the mechanical forces applied by the probing process. These cracks can propagate into the chip and cause corrosion of the interconnects (e.g., copper wiring) resulting in reliability failures.

For example, the probing process using conventional probe techniques (e.g., cantilever—vertical—membrane, etc.) can cause damage on the Al pads and the underlying rigid passivation layer (mostly $SiO_2$, SiN or both materials) below the Al pads. These cracks can propagate through the passivation layer and reach the interconnects (e.g., Cu-wiring). Moisture can penetrate through these cracks into the chip and can cause corrosion of the Cu-wiring. This issue becomes even more important for the interconnects using low-k-(or ultra low-k-) dielectric material with less mechanical strength and less resistance to moisture update.

Similar effects could happen at wire bonding caused by the necessary bonding force so that the bonding tool (capillary or wedge) can cause damages in the layers below the bonding pad.

SUMMARY OF THE INVENTION

The invention concerns a final passivation scheme for integrated circuits with a wafer/substrate with device and interconnect layers, the active area, with a last level interconnect capping layer over the active area and a passivation layer below an aluminum probe/wire bond/flip-chip pad.

In one aspect, the invention propagates a final passivation scheme, which prevents such cracks.

In a second aspect, the invention prevents corrosion of the interconnects that result from the necessary contact force of the contact elements.

In a third aspect, the invention eliminates chip failures due to passivation cracks induced by probing, bonding and flip-chip processes.

In a fourth aspect, the invention improves the flip-chip packaging process yield.

In a fifth aspect, the invention enables probing and packaging of chips using low-k and ultra low-k interconnects.

It is well known that at the end of the manufacturing process of integrated circuits a wafer level electrical probing/testing of the devices needs to be performed in order to determine which devices can be operated properly and selected for further packaging process. However, the probing process using conventional probe techniques (e.g., cantilever—vertical—membrane, etc.) can cause damage on the contact pads (e.g., Al pads) and the underlying rigid passivation layer (e.g., $SiO_2$, SiN, SiON or combinations of same) below the contact pads. These cracks can propagate through the passivation layer and reach the interconnects (e.g., Cu-wiring). Through these cracks moisture can penetrate into the chip and cause corrosion of the Cu-wiring. This issue becomes even more important for the interconnects using low-k (or ultra low-k) dielectric material with less mechanical strength and less resistance to moisture update.

One way of overcoming this issue is to restrict the interconnect layers used below a probe pad (probing/bonding/flip-chip opening window).

In the preferred embodiment of this invention, the insertion of a buffer layer/crack stop layer (e.g. SiLK™, a product of Dow Chemical, or any other material suitable for the invention) within the conventional final passivation flow has been proposed. Another version is the insertion of multiple buffer layers/crack stop layers.

The function of such a buffer layer is to absorb shocks/pressure induced by external mechanical forces (e.g., probing, wire bonding, bumping, wafer grinding w/ and w/o bumps, post- and pre-bump probing etc.).

Another function of buffer layer(s) is to terminate possible crack propagation originated by external mechanical forces below the pads.

The introduction of the buffer layer using a dielectric material with a lower modules material and with high resistance to crack propagation (e.g. SiLK™, a product of Dow Chemical, or any other material suitable for the invention) acts as a buffer/crack propagation stop layer. Therefore, the chip is protected against crack related reliability failures.

BRIEF DESCRIPTION OF THE DRAWINGS

The invention is described now with several examples. In the accompanying drawing are shown.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The starting point of the preferred embodiment of the invention is a chip with multi-level Cu metallization either in combination with conventional (e.g., oxide, nitride) or with low-k dielectrics (e.g., SiLK™, Flare, Coral, Black Diamond, SiCOH, porous low-k, etc.).

Figure 1:
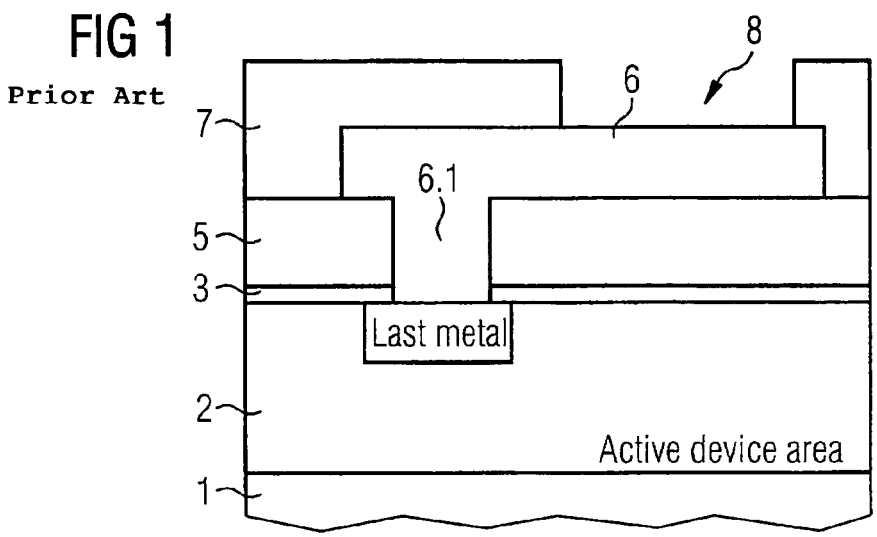
FIG. 1 illustrates an integrated circuit with a multi-level metallization according the prior art with several dielectrics and at the top level with a probing/bonding/flip-chip opening window.

FIG. 1 shows such a passivation scheme according the prior art. The basis of this device is a silicon wafer/substrate 1 with device and interconnect layers 2, an active area and a last level interconnect capping layer 3. The capping layer 3 commonly comprises SiN with a thickness between about 50 to about 200 nm. A passivation layer 5 is deposited above the capping layer 3 and below an aluminum probe/wire bond/flip-chip pad 6. The passivation layer 5 commonly comprises $SiO_2$ or SiN, or both, with a thickness between about 500 nm and about 2000 nm. The Al probe/wire bond/flip-chip pad 6 is connected over a via 6.1 through the passivation layer 5 and through the last level interconnect capping layer 3 with the last metal of the device and interconnect layers 2.

The last layer is a chip passivation 7 made of SiN, $SiO_2$, or both. In addition, BCB (benzo cyclo butene) and polyimides are commonly used. The chip passivation 7 is opened over the Al probe/wire bond/flip-chip pad 6 providing a probing/bonding/flip-chip opening window 8.

Figure 2A:
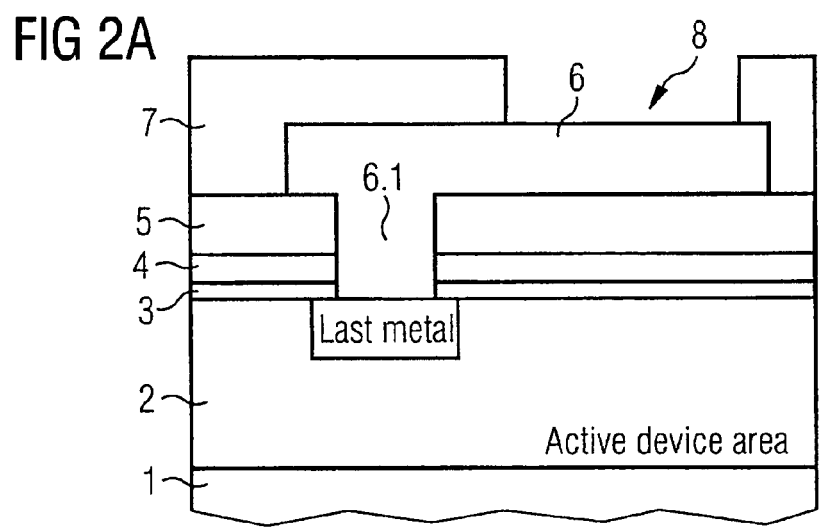
FIG. 2A illustrates an integrated circuit showing a first embodiment of the invention with a buffer layer/crack stop layer between the last metal (upper) layer and an aluminum probe/wire bond/flip-chip pad.
Figure 2B:
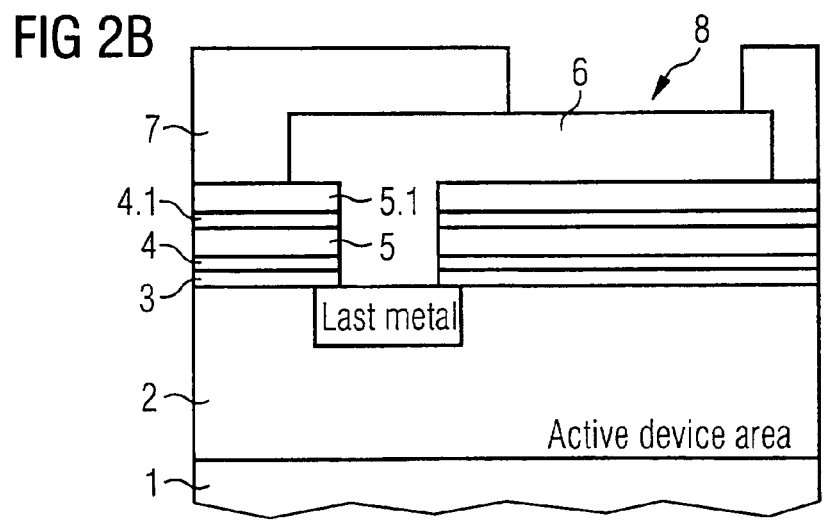
FIG. 2B illustrates an integrated circuit showing a second embodiment of the invention with multiple buffer layers/crack stop layers between the last (upper) metal divided by a capping layer and an aluminum probe/wire bond/flip-chip pad.

FIG. 2, which includes FIGS. 2A and 2B, and FIG. 3, which includes FIGS. 3A-3D, show a first embodiment of the invention with the novel final passivation scheme. This scheme provides for highly reliable final probing.

The device of FIGS. 2 and 3 includes a wafer or substrate 1 that is preferably formed from silicon, although other semiconductors such as silicon germanium or gallium arsenide can be used. The device and interconnect layers are collectively referred to as the active device area and labeled with reference numeral 2. This region includes the active devices (e.g., transistors), passive devices (e.g., capacitors, resistors), and any interconnects (e.g., multilevel copper damascene). The last level interconnect capping layer 3 is explicitly shown. The capping layer 3 commonly comprises SiN (e.g., $Si_3N_4$) with a thickness between about 50 to about 200 nm. Other capping layers such as $SiO_2$ and SiON can also be used.

A buffer layer/crack stop layer 4 is deposited over the capping layer 3. The buffer layer 4 is preferably formed from a lower modulus material with reduced crack propagation properties. For example, a spin-on aromatic thermoset polymer, such as SiLK™ available from Dow Chemical, can be used as the buffer layer 4. Instead of SiLK™ other lower modulus materials are usable, which are suitable for BEOL process integration. The layer preferably has a thickness between about 50 nm and about 400 nm.

All thicknesses depend on material selections, process integration scheme, probing requirements, and other factors. Accordingly, the specific thicknesses provided herein are provided by way of example only.

A passivation layer 5 is deposited over the buffer layer/crack stop layer 4. As shown in FIG. 2A, layer 5 is located below pad 6. The passivation layer 5 commonly comprises an oxide (e.g., $SiO_2$), a nitride (e.g., $Si_3N_4$), or both (e.g., composite layer or SiON) with a thickness of about 1000 nm. The pad 6 may comprise a probe pad, a wire bond pad or a flip-chip pad and may be formed of a metal such as aluminum. The probe pad 6 is disposed over a via 6.1 that is electrically connected with the last level interconnect capping layer 3. In the illustrated example, the probe 6 is physically connected to via 6.1, which is in a contact hole formed through the passivation layer 5, through the buffer layer/crack stop layer 4 and through the last level interconnect capping layer 3, with the last metal of the device and interconnect layers 2.

The last layer is a chip passivation 7, which can be formed from SiN, $SiO_2$ or combinations thereof. Alternatively, passivation layers of BCB and polyimides can be used. The chip passivation 7 is opened over the Al probe/wire bond/flip-chip pad 6, providing a probing/bonding/flip-chip opening window 8.

FIG. 2B shows a second embodiment of the invention with multiple buffer layers/crack stop layers 4, 4.1 and passivation layer 5, 5.1 between the last upper metal in the device and interconnect layers 2 divided by a last level interconnect capping layer 3 and an aluminum probe/wire bond/flip-chip pad 6.

The Al probe/wire bond/flip-chip pad 6 is connected over a via 6.1 through the passivation layer 5, 5.1, through the buffer layer/crack stop layer 4, 4.1 and through the last level interconnect capping layer 3 with the last metal of the device and interconnect layers 2.

FIGS. 3A-3D illustrate a sequence showing the steps to realize such a buffer layer/crack stop layer 4 below the aluminum probe/wire bond/flip-chip pad 6.

Figure 3A:
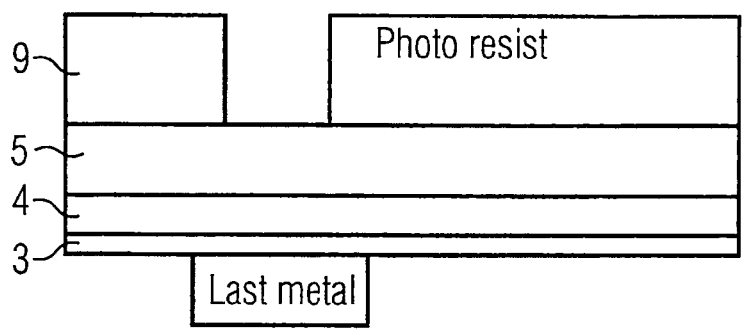
FIGS. 3A-3D illustrates a sequence showing the steps to realize such a buffer layer/crack stop layer below the aluminum probe/wire bond/flip-chip pad.

FIG. 3A presents the last metal in the device and interconnect capping layer 3 covered by a last level interconnect cap layer 3, e.g., a 70 nm SiN cap layer. Over this cap layer is deposited a 200 nm SiLK™ buffer layer 4 by spin-on and cure and over this layer a passivation deposition layer 5 with a thickness of about 1000 nm $SiO_2$. A photoresist 9, which is exposed and developed for Al via patterning, is then applied. The thickness of the buffer layer 4 can vary according to the used material.

Figure 3B:
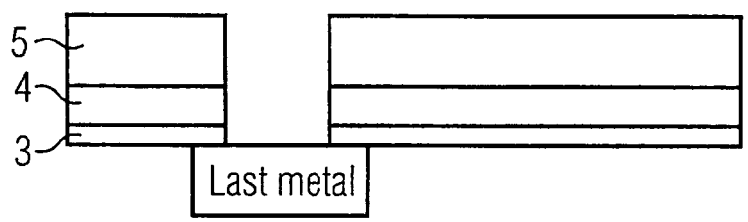

FIG. 3B illustrates etching a contact hole through the passivation layer 5, buffer layer 4 and capping layer 3. In one embodiment, the passivation layer 5 is etched in alignment with mask 9 using the buffer layer 4 as an etch stop. The photoresist 9 is then stripped in a process that also etches the exposed portions of the organic material of layer 5. The capping layer 3 can then be opened and the last metal layer can be cleaned.

Figure 3C:
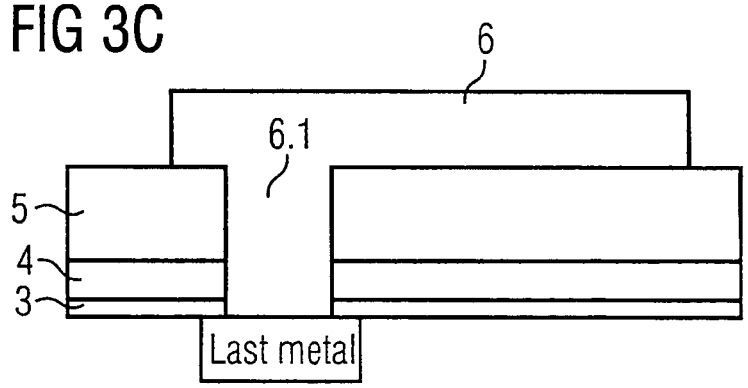

FIG. 3C illustrates the conventional 800 nm Al—Cu-pad metallization with a conventional TaN/TiN/Ti liner (Al probe/wire bond/flip-chip pad 6 and via 6.1) followed by pad area definition and patterning with conventional lithography and Al etch stops. Other materials could alternatively be used.

Figure 3D:
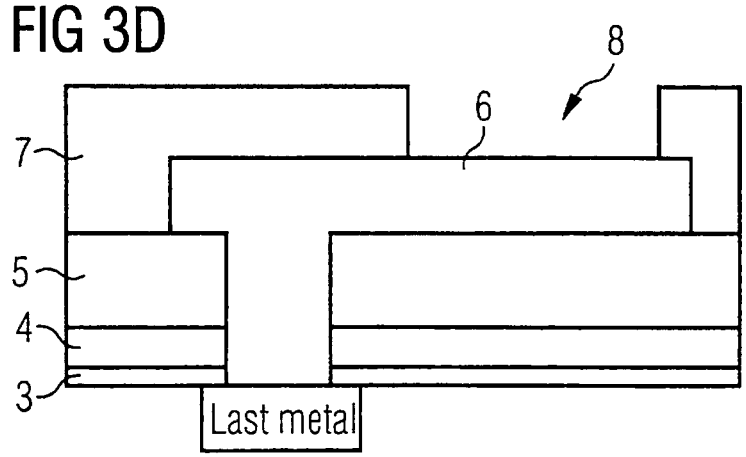

Finally, FIG. 3D illustrates an optional chip passivation, e.g., 400 nm $SiO_2$, 450 nm SiN (chip passivation layer 7) deposition and resist apply, expose and develop and probing/bonding/flip-chip window 8 opening.

What is claimed is:

1. A semiconductor device comprising:
   a substrate including an active area, said active area having at least one last metal conductor, and a portion spaced from said at least one last metal conductor;
   a last level interconnect capping layer disposed over the active area, including said portion spaced from said at least one last metal conductor;
   a first buffer layer/crack stop layer deposited on and coextensive with the last level interconnect capping layer;
   a first passivation layer deposited on and coextensive with the first buffer layer/crack stop layer;
   a second buffer layer/crack stop layer deposited on and coextensive with the first passivation layer;
   a second passivation layer deposited on and coextensive with the second buffer layer/crack stop layer;

an aperture defined in and extending through said capping layer, said first and second buffer layers and said first and second passivation layers, said aperture located over said at least one last metal conductor; and a contact pad overlying the second passivation layer, and including a connection portion and a contact portion, said connection portion filling said aperture and in electrical contact with said at least one last metal conductor, and said contact portion extending from said connection portion such that said contact portion overlies said portion of said substrate spaced from said at least one last metal conductor, but does not overlap said at least one last metal conductor.

2. The device of claim 1 wherein the first buffer layer/crack stop layer, first passivation layer, second buffer layer/crack stop layer, and second passivation layer comprise an arrangement of multiple buffer layers/crack stop layers alternating with the passivation layers all with reduced thickness.

3. The device of claim 1 wherein at least one of the buffer layer/crack layers has a thickness between about 50 nm and about 400 nm.

4. The device of claim 1 wherein the interconnect capping layer has a thickness between about 50 and 200 nm.

5. The device of claim 4 wherein the interconnect capping layer is made of SiN.

6. The device of claim 1 wherein the first passivation layer has a reduced thickness relative to a semiconductor device that does not include a buffer layer/crack stop layer.

7. The device of claim 1 wherein the substrate comprises a silicon substrate and wherein the active area comprises a plurality of transistors formed in and over the substrate.

8. The device of claim 2 wherein said at least one last metal conductor comprises a plurality of copper damascene interconnect lines.

9. The device of claim 1 wherein the contact pad comprises an aluminum pad.

10. The device of claim 1 wherein the contact pad comprises a probe pad.

11. A semiconductor device comprising:
a substrate including an active area, said active area having at least one last metal conductor, and a portion spaced from said at least one last metal conductor;
a last level interconnect capping layer disposed over the active area, including said spaced portion;
a first buffer layer/crack stop layer deposited on and coextensive with the last level interconnect capping layer;
a first passivation layer deposited on and coextensive with the first buffer layer/crack stop layer;
a second buffer layer/crack stop layer deposited on and coextensive with the first passivation layer;
a second passivation layer deposited on and coextensive with the second buffer layer/crack stop layer;
a first aperture defined in and extending through said capping layer, said first and second buffer layers and said first and second passivation layers, said aperture located over said at least one last metal conductor;
a contact pad overlying the second passivation layer, and including a connection portion filling said first aperture and in electrical contact with said at least one last metal conductor and a contact portion extending away from said connection portion; and
a third passivation layer overlying said contact pad and said second passivation layer, said second passivation layer defining a contact aperture having an outside perimeter, said contact aperture spaced from said connection portion of said contact pad such that said outside perimeter of said contact aperture does not overlap said connection portion.

12. The device of claim 11 wherein the first buffer layer/crack stop layer, first passivation layer, second buffer layer/crack stop layer, and second passivation layer comprise an arrangement of multiple buffer layers/crack stop layers alternating with the passivation layers all with reduced thickness.

13. The device of claim 12 wherein said at least one last metal conductor comprises a plurality of copper damascene interconnect lines.

14. A semiconductor device comprising:
a substrate including an active area;
a last level interconnect capping layer disposed on and coextensive with the active area;
a first buffer layer/crack stop layer having a first thickness deposited on and coextensive with the last level interconnect capping layer;
a first passivation layer having a second thickness greater than said first thickness deposited on and coextensive with the first buffer layer/crack stop layer;
a second buffer layer/crack stop layer deposited on and coextensive with said first passivation layer;
a second passivation layer deposited on and coextensive with the second buffer layer/crack stop layer; and
a contact pad overlying the second passivation layer.

15. The device of claim 14 wherein said second buffer layer/crack stop layer has a third thickness, and said second passivation layer has a fourth thickness greater than said third thickness.

16. The device of claim 15 wherein the first buffer layer/crack stop layer, first passivation layer, second buffer layer/crack stop layer, and second passivation layer comprise an arrangement of multiple buffer layers/crack stop layers alternating with the passivation layers all with reduced thickness.

17. The device of claim 16 wherein said at least one last metal conductor comprises a plurality of copper damascene interconnect lines.

* * * * *